(12) United States Patent
Wang et al.

(10) Patent No.: US 12,713,884 B2
(45) Date of Patent: Aug. 18, 2026

(54) BACK END OF LINE (BEOL) INTERCONNECTION APPROACH

(71) Applicant: Tokyo Electron Limited, Tokyo (JP)

(72) Inventors: Peng Wang, Albany, NY (US); Emilia Hirsch, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 347 days.

(21) Appl. No.: 18/617,088

(22) Filed: Mar. 26, 2024

(65) Prior Publication Data

US 2025/0308986 A1 Oct. 2, 2025

(51) Int. Cl.

| | |
|---|---|
| ***H10W 20/00*** | (2026.01) |
| ***H10P 50/00*** | (2026.01) |
| ***H10W 20/42*** | (2026.01) |

(52) U.S. Cl.

CPC ........... *H10W 20/074* (2026.01); *H10P 50/73* (2026.01); *H10W 20/056* (2026.01); *H10W 20/081* (2026.01); *H10W 20/42* (2026.01)

(58) Field of Classification Search

CPC ... H10P 50/73; H10W 20/074; H10W 20/081; H10W 20/42; H10W 20/056

See application file for complete search history.

(56) References Cited

U.S. PATENT DOCUMENTS

| | | | | |
|---|---|---|---|---|
| 2015/0262860 | A1* | 9/2015 | Kao | H10W 20/072<br>438/653 |
| 2020/0020849 | A1* | 1/2020 | Tien | G11C 11/161 |
| 2022/0181207 | A1* | 6/2022 | Ho | H10W 20/069 |
| 2022/0352326 | A1* | 11/2022 | Huang | H10D 64/017 |
| 2023/0013764 | A1* | 1/2023 | Chou | H10D 1/692 |
| 2025/0140696 | A1* | 5/2025 | Hung | H10W 20/033 |

* cited by examiner

*Primary Examiner* — Mohsen Ahmadi
(74) *Attorney, Agent, or Firm* — Oblon, McClelland, Maier & Neustadt, L.L.P.

(57) ABSTRACT

A method during a back-end-of-line (BEOL) process for making a semiconductor device includes forming a first dielectric layer over a metal layer disposed on a substrate and a first etch stop layer over the first dielectric layer, forming a via that extends through the first etch stop layer and the first dielectric layer, filling the via with a sacrificial material, forming a second dielectric layer over the first etch stop layer and the via that is filled with the sacrificial material, and performing a first etch process to form a trench in the second dielectric layer, the trench being landed on the first etch stop layer and aligned with the via, the sacrificial material filled in the via being removed during the first etch process.

17 Claims, 8 Drawing Sheets

201
220
217
216
215
214
213
212
211
PR
SiARC
OPL
MIDDLE ESL
LOW-k
BOTTOM ESL
Cu (M0)

221
222

214
213
212
211
231
222
231
221

214
213
212
211
222
221

BACK END OF LINE (BEOL) INTERCONNECTION APPROACH

TECHNICAL FIELD

The present disclosure relates to semiconductor devices and manufacturing processes. Methods for forming interconnection structures in back-of-line (BEOL) processing are disclosed.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

When preparing a new interconnect level on a semiconductor substrate, an etch stop layer is typically formed overlying the preceding interconnect layer, followed by the formation of the low-k dielectric layer and one or more layers, such as a hardmask, overlying the low-k dielectric layer. Upon formation of the film stack, lithography and etch processing are utilized to pattern the low-k dielectric layer for subsequent metallization processes. The low-k dielectric layer may be patterned with a trench-via structure according to various integration schemes, including dual damascene integration, single damascene integration, and the like. A metal line in the trench and a contact plug in the via can provide electrical continuity between interconnect levels or within the interconnect level.

SUMMARY

Aspects of the disclosure provide a method. The method can include forming a first dielectric layer over a metal layer disposed on a substrate and a first etch stop layer over the first dielectric layer, during a back-end-of-line (BEOL) process for making a semiconductor device, forming a via that extends through the first etch stop layer and the first dielectric layer, filling the via with a sacrificial material, forming a second dielectric layer over the first etch stop layer and the via that is filled with the sacrificial material, and performing a first etch process to form a trench in the second dielectric layer, the trench being landed on the first etch stop layer and aligned with the via, the sacrificial material filled in the via being removed during the first etch process.

In an embodiment, the method can further include forming a second etch stop layer over the metal layer and below the first dielectric layer. The forming the via includes forming the via by performing a second etch process with the second etch stop layer as an etch stop layer.

In an embodiment, the forming the via that extends through the first etch stop layer and the first dielectric layer includes forming the via that extends through the first etch stop layer, the first dielectric layer, and the second etch stop layer. In an embodiment, the second etch stop layer at a bottom of the via is removed to expose the metal layer after the sacrificial material filled in the via is removed during the first etch process. In an embodiment, the sacrificial material includes an organic material.

An embodiment of the method can further include performing an etch process or a chemical mechanical planarization (CMP) process to remove excessive sacrificial material before forming the second dielectric layer over the first etch stop layer and the via that is filled with the sacrificial material.

In an embodiment, the forming the via that extends through the first etch stop layer and the first dielectric layer includes forming a via pattern in a photoresist layer disposed over an antireflective coating (ARC) disposed over an organic planarization layer (OPL) covering the first etch stop layer, transferring the via pattern into the first etch stop layer and the first dielectric layer, and removing the photoresist layer, the ARC, and the OPL.

An embodiment of the method can further include forming a trench pattern in a hardmask disposed over the second dielectric layer, the trench pattern defining the trench to be aligned with the via filled with the sacrificial material, wherein the trench pattern is transferred into the second dielectric layer during the first etch process to form the trench.

In an embodiment, the first dielectric layer and the second dielectric layer each have a dielectric constant lower than 3. In an embodiment, the first etch stop layer includes silicon nitride, silicon carbide, silicon carbonitride, boron-doped silicon, silicon dioxide, oxygen-and-nitrogen-doped silicon carbide, or a combination of two or more thereof.

Aspects of the disclosure provide a semiconductor device. The semiconductor device can include a first dielectric layer, a first etch stop layer over the first dielectric layer, a second dielectric layer over the first etch stop layer, and a conductive interconnect structure including a via portion and a trench portion, the trench portion extending in the second dielectric layer and a bottom of the trench portion landing on the first etch stop layer, the via portion disposed in the first dielectric layer and connected with the trench portion through the first etch stop layer.

An embodiment of the semiconductor device can further include a metal wiring layer inlaid in a substrate, and a second etch stop layer over the metal wiring layer and underlying the first dielectric layer. The via portion is in connection with the metal wiring layer through the second etch stop layer.

Aspects of the disclosure provide another method. The method can include forming a first etch stop layer over a metal layer disposed on a substrate, a first dielectric layer on the first etch stop layer, and a second etch stop layer over the first dielectric layer, during a back end of line (BEOL) process for making a semiconductor device, forming, by a first etch process based on the first etch stop layer, a via that extends through the second etch stop layer and the first dielectric layer and reaches the first etch stop layer, filling the via with a sacrificial material, forming a second dielectric layer over the second etch stop layer and the via that is filled with the sacrificial material, forming a trench pattern in a hardmask disposed over the second dielectric layer, the trench pattern defining a trench that is aligned with the via that is filled with the sacrificial material, performing a second etch process to transfer the trench pattern into the second dielectric layer, wherein, during the second etch process, a bottom of the trench is landed on the second etch stop layer, the sacrificial material filled in the via is removed, and the metal layer is exposed, and filling the trench and the via with a conductive material.

BRIEF DESCRIPTION OF THE DRAWINGS

Various embodiments of this disclosure that are proposed as examples will be described in detail with reference to the following figures, wherein like numerals reference like elements. It is noted that, in accordance with the standard practice in the industry, various features are not drawn to scale. In fact, the dimensions of the various features may be arbitrarily increased or reduced for clarity of discussion.

DETAILED DESCRIPTION OF EMBODIMENTS

Figure 1:
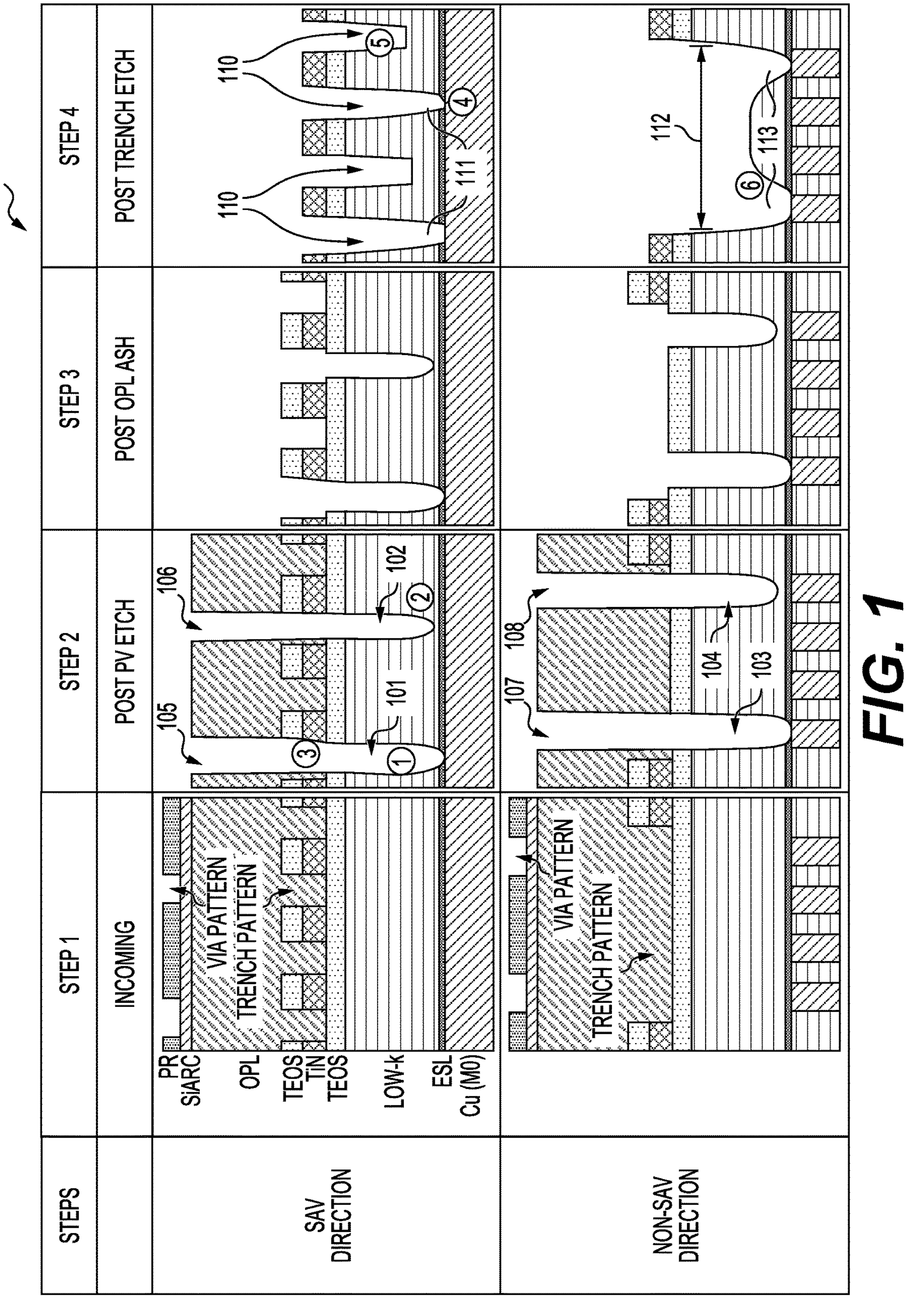
FIG. 1 shows a traditional back end of line (BEOL) dual damascene etch process 100 and typical issues associated with the process 100.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

I. Traditional BEOL Dual Damascene Etch Process and Typical Issues

FIG. 1 shows a traditional back end of line (BEOL) dual damascene etch process 100 and typical issues associated with the process 100. Six issues are identified and labelled from (1) to (6). The process 100 is shown in 4 steps, from Step 1 to Step 4. Two cross-sectional views are provided for each step. The upper sequence of cross-sectional views corresponds to a first cutting plane that is perpendicular to the substrate and along a first direction, referred to as the self-aligned via (SAV) direction. The lower sequence of cross-sectional views corresponds to a second cutting plane perpendicular to the substrate and along a second direction, referred to as the non-SAV direction. The SAV direction is perpendicular to the non-SAV direction.

At Step 1, a film stack is provided that includes a metal wiring layer, such as a metal level 0 (M0), a metal level 1 (M1), and the like, formed with a conductive material (e.g., copper (Cu)), overlying a substrate (not shown), an etch stop layer (ESL), a dielectric layer (e.g., a low dielectric constant (low-k) dielectric layer), a first mask layer (e.g., a first tetraethyl orthosilicate (TEOS) layer), a metal hardmask (e.g., a titanium nitride (TiN) metal hardmask), a second mask layer (e.g., a second TEOS layer), an organic planarization layer (OPL), a silicon-containing anti-reflective coating (SiARC), and a photoresist (PR) layer. These layers or films are stacked vertically over the substrate. A trench pattern is defined in the second TEOS layer and the TiN metal hardmask. A via pattern is defined by the PR layer.

As shown in the upper cross-sectional view of Step 1, 4 trenches extending in the non-SAV direction are defined by the trench pattern, and 2 vias aligned with two respective trenches are defined by the via pattern. As shown in the lower cross-sectional view of Step 1, one trench extending in the non-SAV direction is defined by the trench pattern, and two vias aligned with the same trench are defined by the via pattern.

At Step 2, a first etch process is performed to transfer the via pattern into the low-k dielectric layer, forming partial vias (PVs). As shown, 2 PVs 101-102 are shown in the upper cross-sectional view, and another 2 PVs 103-104 are shown in the lower cross-sectional view. The via openings 105-108 corresponding to the PVs 101-104 can cross through the whole film stack vertically and have high aspect ratios. The high aspect ratios bring difficulty to control via profiles during the etch process. Consequently, via sidewalls may bow (Issue (1)), leading to neighboring interconnect structures being overly close to each other. This may cause leakage or increase signal interference. Also, the bottoms of the vias may land at different depths into the dielectric layer. This may cause via depth loading issue (Issue (2)).

Further, because the TiN metal hardmask is used for defining trench patterns, the via openings 105-108 have to align with and pass through the trench patterns. This may cause the TiN metal hardmask encroachment issue (Issue (3)) in case misalignment happens. To mitigate the metal hardmask encroachment issue, the processing requirements of etch selectivity between the metal hardmask and other films (e.g., the low-k dielectric) and alignment accuracy between via patterns and trench patterns have to be increased, causing additional cost.

At Step 3, an ash process, for example, is performed to remove the OPL.

At Step 4, a second etch process is performed to transfer the trench pattern into the low-k dielectric layer, forming trenches 110 and 112. At the same time, the PVs 101-104 are further deepened and transformed to full vias 111 and 113 during the second etch process. As described above, the high aspect ratios of the via openings 105-108 may result in variations of the PV depths (Issue (2)), which may eventually lead to variations of the bottom critical dimensions (CDs) of the full vias. Some full vias may have small via bottom CDs (Issue (4)), leading to undesired higher contact resistance at the interface between the full vias and the underlying metal layer.

In addition, because no ESL is employed for the trench etching, resulting the trenches typically have a tapered trench profile (Issue 5). This leads to a higher line resistance, compared with trenches having a more straightened vertical sidewall, which is undesired. Further, because no ESL is employed for the trench etching, the trench profile at the trench bottom and the via profile at the via sidewalls can be difficult to control. This may result in the via chamfer issue (Issue (6)). The resulting via chamfer may introduce higher parasitic capacitance in the interconnect structure, and, in a worse case, cause via-trench leakage or short.

II. Novel BEOL Interconnection Process Flow

FIGS. 2A-2G show a novel BEOL interconnect fabrication process for making a semiconductor device according to embodiments of the disclosure. The process provides solutions to solve the issues described above. The process can include a first single damascene via etch process for forming via structures, shown in FIGS. 2A-2C, and a second single damascene trench etch process for forming trench structures, shown in FIGS. 2E-2G. A first dielectric layer (referred to as via dielectric layer) and a second dielectric layer (referred to as trench dielectric layer) can be formed separately and successively. The via structures are formed through the via dielectric layer, while the trench structures are formed through the trench dielectric layer. The via dielectric layer and the overlying trench dielectric layer together form an inter/intra level dielectric (ILD) layer for a same BEOL interconnect level.

Figures 2A, 2B:
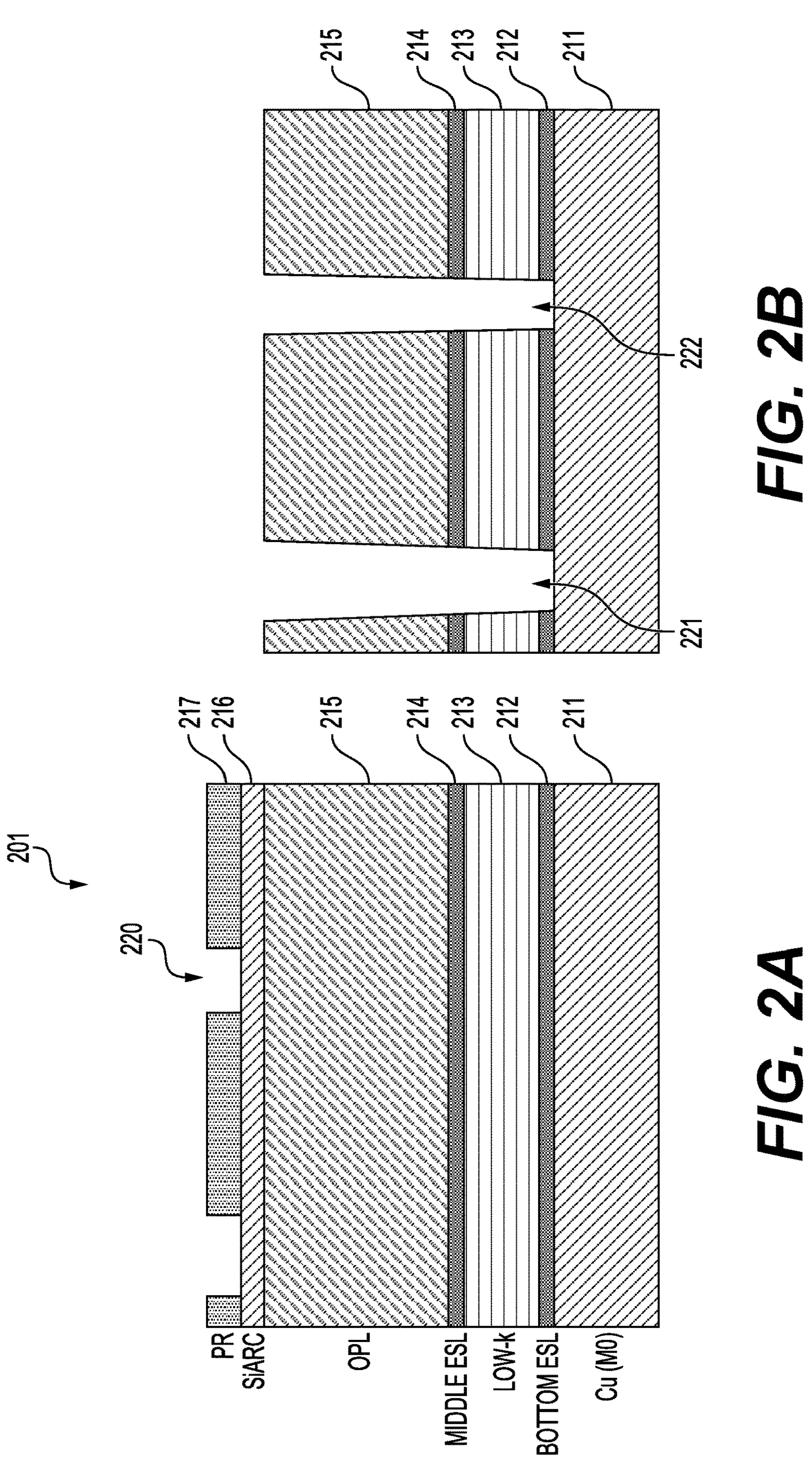
FIGS. 2A-2G show a novel BEOL interconnect fabrication process for making a semiconductor device according to embodiments of the disclosure.

FIG. 2A shows a film stack 201 that is provided at the beginning of the BEOL interconnect fabrication process. The film stack 201 includes a metal wiring layer 211, a bottom ESL 212, a first dielectric layer 213 (via dielectric layer), a middle ESL 214, an OPL 215, an ARC layer 216, and a PR layer 217. Those layers 211-217 are stacked vertically over a substrate (not shown).

The metal wiring layer 211 (or referred to as metal layer) can be inlaid in an ILD layer deposited over the substrate. The metal wiring layer 211 can include any suitable conductive materials, such as aluminum (Al), copper (Cu), and the like. The metal wiring layer 211 can include trench lines or via plugs that provide inter/intra level interconnects. In one example, the metal wiring layer 211 can correspond to M0, M1, or the like. In the FIG. 2A example, a copper trench line is shown to extend laterally.

The bottom ESL 212 serves as an etch stop layer during the first single damascene via etch process when via patterns are transferred into the dielectric layer 213. The bottom ESL 212 can also function as a diffusion barrier preventing active particles (e.g., irons or elements) crossing the border between the dielectric layer 213 and the metal wiring layer 211. Also, the bottom ESL 212 can protect the underlying metal wiring layer 211 from being exposed and damaged during later-stage etching or other processing.

The bottom ESL 212 can include a single layer or multiple layers. The bottom ESL 212 can include a nitrogen doped silicon carbide, or Si—N—C—H. The bottom ESL 212 can include silicon nitride ($SiN_y$), silicon carbide ($SiC_y$), silicon carbonitride ($SiC_xN_y$), or $SiC_xN_yH_z$, or a combination thereof, in some embodiments. For example, the bottom ESL 212 can include SiCN, SiCO/SiCN, $Si_3N_4$, or SiCO/Si3N4. The bottom ESL 212 can include other materials in various embodiments.

The bottom ESL 212 can be formed using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique. Other systems and methods for forming a thin film on a substrate are well known to those skilled in the art of both spin-on technology and vapor deposition technology.

The dielectric layer 213 can include a material layer or a plurality of material layers. For instance, the dielectric layer 213 may include an organosilicon glass, such as a Si—O—C—H type materials, or SiCOH-containing layer having silicon (Si), carbon (C), oxygen (O), and hydrogen (H). Moreover, the dielectric layer 213 may comprise a low-k or ultra-low-k dielectric layer having Si, C, O, and H. A nominal dielectric constant value of the dielectric layer can be less than the dielectric constant of $SiO_2$, which is approximately 4 (e.g., the dielectric constant for thermal silicon oxide can range from 3.8 to 3.9). More specifically, the dielectric layer 213 may have a dielectric constant of less than 3.7, or a dielectric constant ranging from 1.6 to 3.7. The dielectric may be non-porous or porous. In some examples, the dielectric layer 213 can have a dielectric constant value larger than the dielectric constant of $SiO_2$. In some examples, the dielectric layer 213 includes $SiO_2$. In some examples, the dielectric layer 213 include TEOS.

The dielectric layer 213 can be formed using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique. Other systems and methods for forming a thin film on a substrate are well known to those skilled in the art of both spin-on technology and vapor deposition technology.

The middle ESL 214 can include a single layer or multiple layers. The middle ESL 214 can include a nitrogen doped silicon carbide, or Si—N—C—H. The middle ESL 214 can include silicon nitride (SiNy), silicon carbide (SiCy), silicon carbonitride (SiCxNy), or SiCxNyHz, or a combination thereof, in some embodiments. For example, the middle ESL 214 can include SiCN, SiCO/SiCN, Si3N4, or SiCO/Si3N4. The middle ESL 214 can include other materials in various embodiments. The middle ESL 214 and the bottom ESL 212 can include the same or different materials.

The middle ESL 214 can be formed using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique. Other systems and methods for forming a thin film on a substrate are well known to those skilled in the art of both spin-on technology and vapor deposition technology.

The OPL 215 may include organic polymers that are spin-coated onto the wafer surface to fill in any topographical irregularities and planarize the surface. Examples include polyimides, polybenzoxazoles, and polyarylene ethers. The OPL 215 may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

The ARC layer 216 possesses material properties suitable for use as an anti-reflective coating. Additionally, the ARC layer is selected to be compatible with the overlying photoresist layer and the lithographic wavelength, i.e., ArF, KrF, etc. The ARC layer may be formed using vapor deposition techniques or spin-on techniques. In the FIG. 2A example, the ARC layer 216 is a silicon-containing ARC (SiARC) layer.

The PR layer 217 can include a layer of radiation-sensitive material. For example, the layer of radiation-sensitive material may include 248 nm resists, 193 nm resists, 157 nm resists, extreme ultraviolet (EUV) resists, or electron sensitive resists. The PR layer 217 may be formed using spin-on techniques.

The PR layer 217, the ARC layer 216, and the OPL 215 together form a tri-layer lithographic mask for patterning the underlying dielectric layer 213. In other examples, a lithographic mask having a different composition may be employed in place of the tri-layer lithographic mask. For example, such lithographic mask can include one or more layers. For example, the lithographic mask may comprise a layer of radiation-sensitive material, such as a light-sensitive material or photoresist, overlying an anti-reflective coating (ARC) layer. For example, the lithographic mask may include a bi-layer mask, or multi-layer mask, having an ARC, such as a bottom ARC (BARC) layer, a sacrificial layer, or a TERA (tunable etch-resistant ARC) layer, embedded therein.

One or more of the layers serving as the lithographic mask may be formed using a track system. Other systems and methods for forming a photoresist film on a substrate are well known to those skilled in the art of spin-on resist technology. The coating of the photoresist layer may include any or all processes known to those skilled in the art of preparing such films including, but not limited to, performing a cleaning process prior to the coating process, performing a post-application bake (PAB) following the coating process, etc.

As shown in FIG. 1, a via pattern 220 is formed in the PR layer 217 using lithographic techniques. For example, the PR layer 217 may be imaged with an image pattern, and thereafter developed. The exposure to EM radiation is performed in a dry or wet photo-lithography system. The image pattern may be formed using any suitable conventional stepping lithographic system or scanning lithographic system.

FIG. 2B shows vias 221-222 formed through the dielectric layer 213 by performing a series of etch processes. For example, when the tri-layer lithographic mask is employed, the via pattern 220 may be transferred to the ARC layer 216 and the OPL 215 using dry development techniques and/or wet development techniques known to those skilled in the art. The PR layer 217 and the ARC layer 216 can be stripped in some examples. The via pattern 220 is transferred to the OPL 215.

The via pattern 220 formed in the OPL 215 is transferred through the film stack 201 using one or more etch processes. Various control schemes can be applied during the etch processes to achieve etch selectivity between the dielectric layer 213 and the underlying bottom ESL 212. The etch processes may include a dry etch process or a wet etch process. The etch process may include a dry plasma etch process or a dry non-plasma etch process. Alternatively, as would be understood by one skilled in the art, any suitable etch process chemistry can be employed that selectively etches the dielectric layer 213 relative to the bottom ESL 212. A further etch process can be applied to remove the bottom ESL 212 to expose the metal wiring layer 211 in the FIG. 2B example. However, in other examples, the bottom ESL 212 may be retained until a later stage. The retained bottom ESL 212 can protect the metal wiring layer 211 from being damaged during one or more downstream processing processes.

Comparing FIG. 2B with FIG. 1, it can be seen that the via dielectric layer 213 is thinner than the low-k dielectric layer in FIG. 1, and, thus, the resulting via structures can have a smaller aspect ratio of via height to via width. Due to this smaller via aspect ratio, a better via profile control can be obtained compared to the via formation in the traditional dual damascene etch process. For example, the via bowing defects (Issue (1)) can be eliminated or reduced, the via bottom CD can reach a desired size (Issue (4)), and the via depth landing issue (Issue (2)) can be avoided. Additionally, there is no metal hardmask existing when forming the vias 221-222. The strict requirements of etch selectivity between the metal hardmask and the dielectric layer and via-trench alignment accuracy can be removed (Issue (3)), thus simplifying the etch process and reducing the fabrication cost.

Figures 2C, 2D:
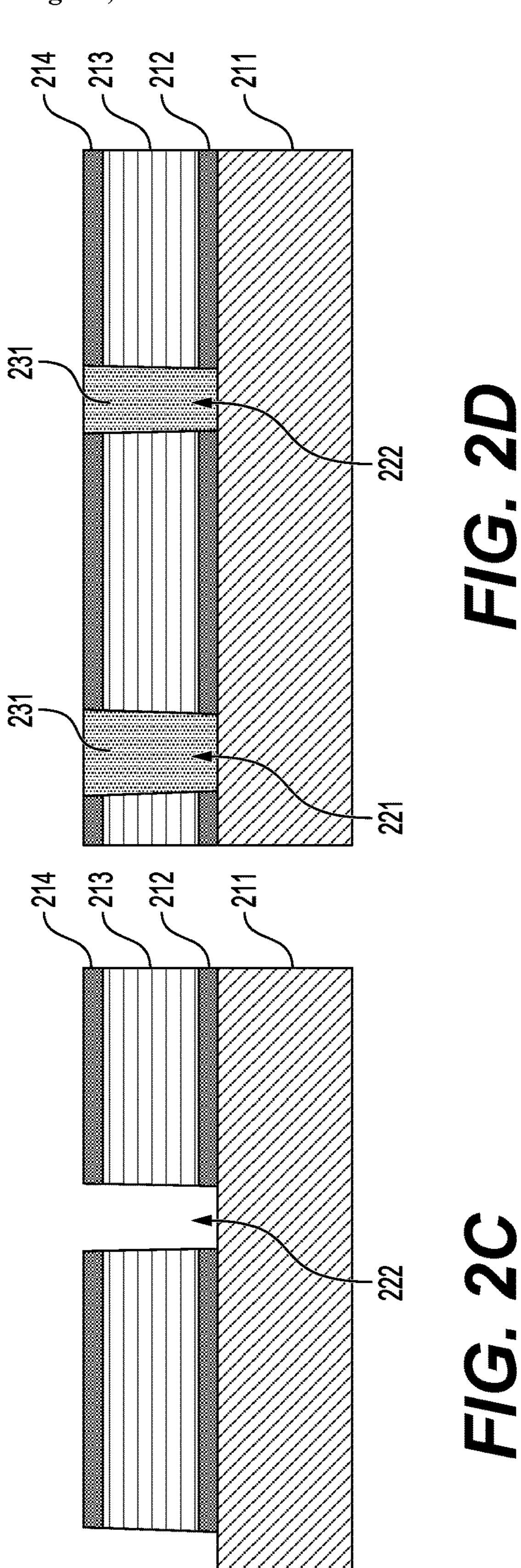

FIG. 2C shows the film stack 201 after the OPL 215 is stripped. For example, an ash process or a dry plasma etch process can be performed to remove the OPL 215.

In FIG. 2D, the vias 221-222 are filled with a sacrificial material 231 during a via plug filling process. The sacrificial material (via plugs) 231 can protect the via from being damaged by later-stage processing (e.g., trench etch). The sacrificial material 231 can include an organic material in some examples. For example, the sacrificial material 231 can include the material(s) for forming the OPL 215, the materials for forming the ARC layer 216 (e.g., SiARC, or bottom ARC), amorphous carbon (a-C), and the like. The sacrificial material 231 can include non-organic material. In various examples, the sacrificial material 231 can be filled into the vias 221-222 using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique. For example, the excessive sacrificial material above the middle ESL 214 can be recessed by an etch process, a CMP process, or the like. The upper surface of the sacrificial material 231 filled in the via holes can be flush with or recessed below the middle ESL 214.

Figures 2E, 2F:
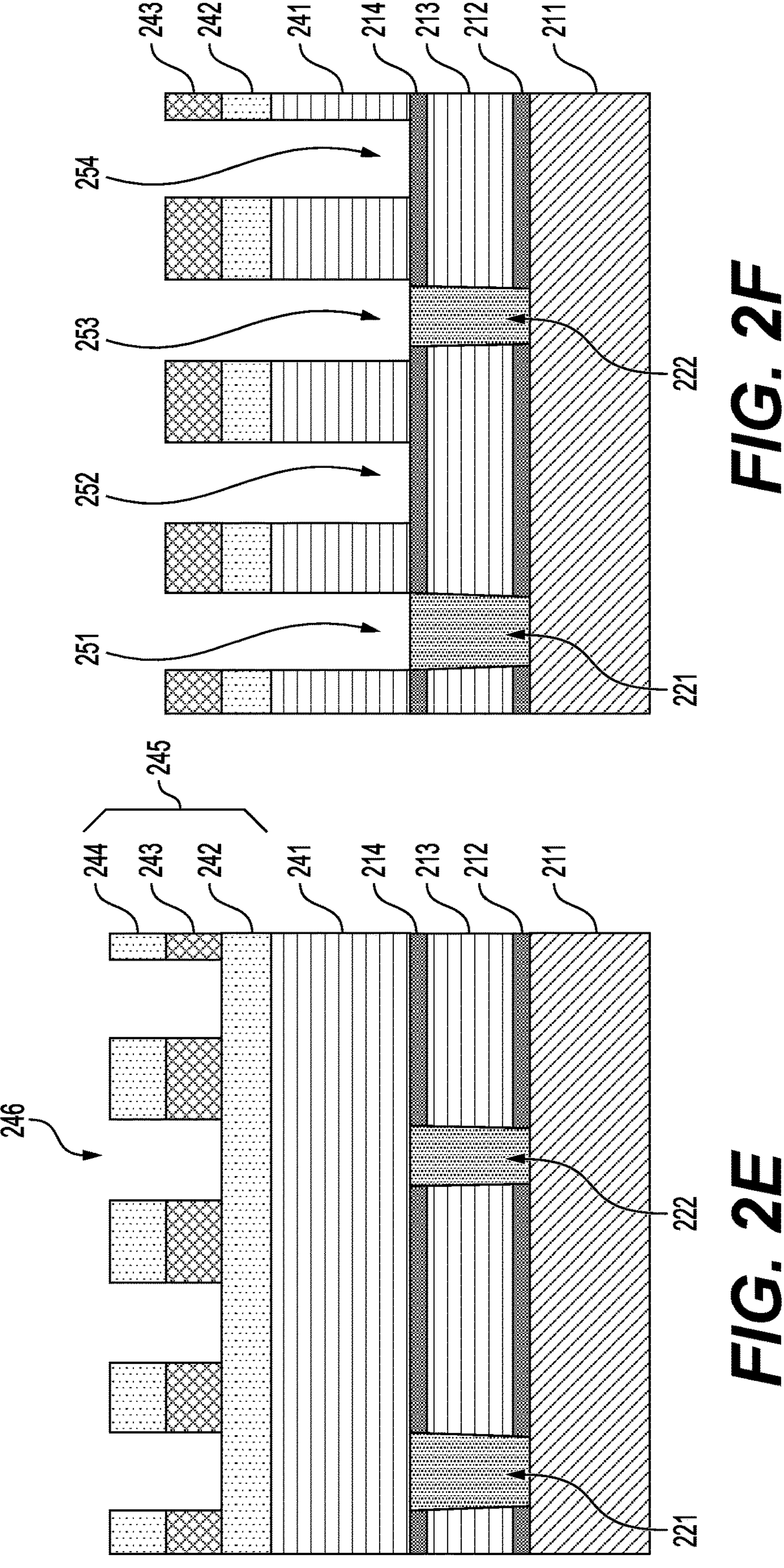
Figure 2G:
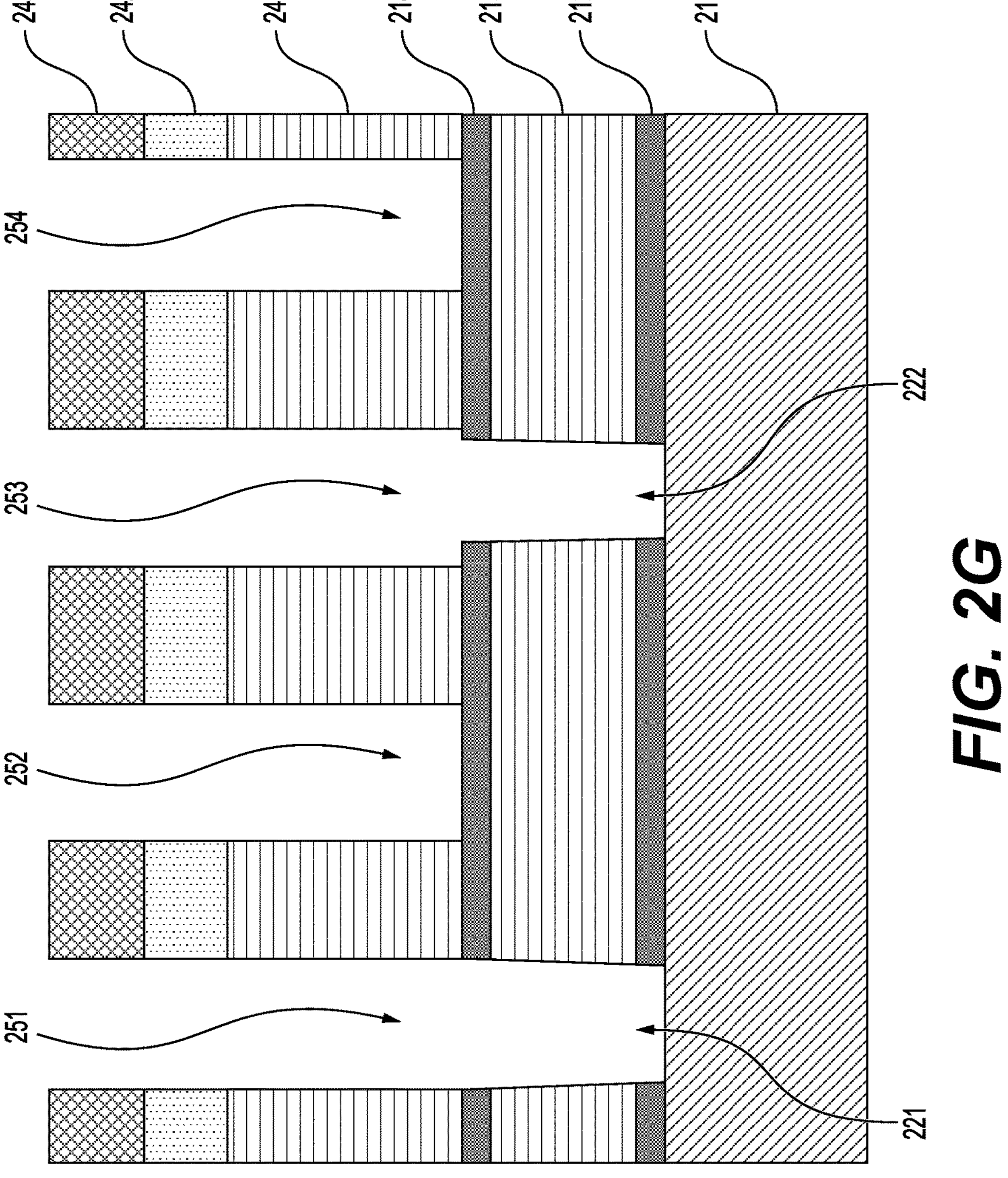

From FIG. 2E to FIG. 2G, the single damascene trench etch process is performed.

In FIG. 2E, a second dielectric layer 241 (trench dielectric layer) is formed over the middle ESL 214 and the vias 221-222 with the fillings. The dielectric layer 241 can include a material layer or a plurality of material layers. For instance, the dielectric layer 241 may include an organosilicon glass, such as a Si—O—C—H type materials, or SiCOH-containing layer having silicon (Si), carbon (C), oxygen (O), and hydrogen (H). Moreover, the dielectric layer 241 may comprise a low-k or ultra-low-k dielectric layer having Si, C, O, and H. A nominal dielectric constant value of the dielectric layer can be less than the dielectric constant of SiO2, which is approximately 4 (e.g., the dielectric constant for thermal silicon oxide can range from 3.8 to 3.9). More specifically, the dielectric layer 241 may have a dielectric constant of less than 3.7, or a dielectric constant ranging from 1.6 to 3.7. The dielectric may be non-porous or porous. In some examples, the dielectric layer 241 can have a dielectric constant value larger than the dielectric constant of SiO2. In some examples, the dielectric layer 241 includes SiO2. In some examples, the dielectric layer 241 include TEOS.

The dielectric layer 241 can be formed using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique. Other systems and methods for forming a thin film on a substrate are well known to those skilled in the art of both spin-on technology and vapor deposition technology.

In FIG. 2E, a hardmask 245 for trench patterning is formed over the dielectric layer 241 (trench dielectric layer). The hardmask 245 may include a single layer or multiple layers. For example, the hardmask 245 may include at least one layer containing Si, or at least one layer containing Si and O, or at least one layer containing a metal. For example, the hardmask 245 may include a metal-containing layer, including such as titanium (Ti), titanium nitride (TiN), tantalum (Ta), tantalum nitride (TaN), aluminum (Al), or aluminum copper alloy (Al—Cu). For example, the hardmask 245 may include a dielectric material, such as silicon carbide ($SiC_y$), silicon oxide ($SiO_y$), silicon nitride ($SiN_y$), or silicon oxynitride ($SiO_yN_z$), or amorphous carbon (a-C). The hardmask 245 can be formed using a vapor deposition process, such as chemical vapor deposition (CVD), or plasma enhanced CVD (PECVD).

In the FIG. 2E example, the hardmask 245 includes a first hardmask 242 (such as a TEOS layer), a metal hardmask 243 (such as a TiN metal) overlying the first hardmask 242, and a second hardmask 244 overlying the metal hardmask 243. A trench pattern 246 is formed through the second hardmask 244 and the metal hardmask 243. For example, a trench pattern can be formed in a lithographic mask and then transferred into the hardmask 245 using a first etch process. The first etch process may include a dry etch process or a wet etch process. Optionally, following the transfer of the trench pattern to the hardmask 245, the lithographic mask can be removed.

In FIG. 2F, the trench pattern 246 is transferred from the hardmask 245 into the first hardmask 242 and the dielectric layer 241 by performing a second etch process. Four trenches 251-254 can be formed. The second etch process may include a dry etch process or a wet etch process. The etch process may include a dry plasma etch process or dry non-plasma etch process. Alternatively, as would be understood by one skilled in the art of dry plasma etching, any etch process chemistry can be employed that selectively etches the first hardmask 242 and the dielectric layer 241 relative to other layers including the metal hardmask 243 and the middle ESL 214.

The trenches 251-254 extend in a direction perpendicular to the section plane of FIG. 2F (non-SAV direction). The trenches 251-254 land on the middle ESL 214. In FIG. 2F, the trenches 251 and 253 are aligned with the vias 221-222. The bottoms of trenches 251 and 253 can be landed on or within the middle ESL 214, except the regions at the top of the vias 221-222. Due to the employment of the middle ESL 214, a better trench profile control of the trenches 251-254 can be obtained during the second etch process, resulting in straighter trench sidewalls compared with tapered sidewalls in Step 4 of FIG. 1. The high trench line resistance issue cased by tapered trench profile (Issue (5)) can be solved. The bottoms of the trenches 251-254 may enter the middle ESL 214 in some cases. Further, the sacrificial material 231 filled in the vias 221-222 can protect the dielectric layer 213 from being damaged during the second trench etch process for patterning the trench dielectric layer 241.

In FIG. 2G, the sacrificial material 231 is removed from the vias 221-222 by performing a third etch process. The third etch process may include a dry etch process or a wet etch process. The etch process may include a dry plasma etch process or dry non-plasma etch process. Alternatively, as would be understood by one skilled in the art of dry plasma etching, any etch process chemistry can be employed that selectively etches the sacrificial material relative to other layers including the metal hardmask 243, the middle ESL 214, the trench dielectric layer 241, and the via dielectric layer 213.

In an example, the second etch process for patterning the trench dielectric layer 241 and the third etch process for removing the via filling material (the sacrificial material 231) can be performed in one etch process in a continuous manner. The sacrificial material 231 is removed in situ during the one etch process. For example, the one etch process can be a dry plasma etch process or dry non-plasma etch process.

In an example, the bottom ESL 212 at the bottom of the vias 221-222 may be retained until the stage of FIG. 2G. The retained bottom ESL 212 can protect the metal wiring layer 211 from being damaged during the trench etch process in FIG. 2F. In such a case, in FIG. 2G, the bottom ESL 212 at the bottom of the vias 221-222 can be removed in situ, following the removal of the via filling material, during the one etch process. The metal wiring layer 211 thus is exposed at the bottom of the vias 221-222.

After the stage of FIG. 2G, a metallization process can be performed to fill a conductive material into the vias 221-222 and the trenches 251-254. For example, a barrier layer may first be deposited conformally over the wafer followed by a conformal deposition of a seed layer. A metal can be deposited conformally to fill the trenches 251-254 and the vias 221-222 overlying the seed layer. A CMP process can be performed to remove the excessive metal, the metal hardmask 243, and the first hardmask 242. As a result, a new level of metal wiring layer of the semiconductor device is formed in the ILD layer which combines the via dielectric layer 213 and the trench dielectric layer 241 with the middle ESL 214 in-between. For example, a conductive interconnect structure in the new level of metal wiring layer of the semiconductor device can include a via portion and a trench portion. The trench portion extends in the trench dielectric layer 241 and a bottom of the trench portion lands on the middle ESL 214. The via portion is disposed in the via dielectric layer 213 and connected with the trench portion through the middle ESL 214.

Figure 2H:
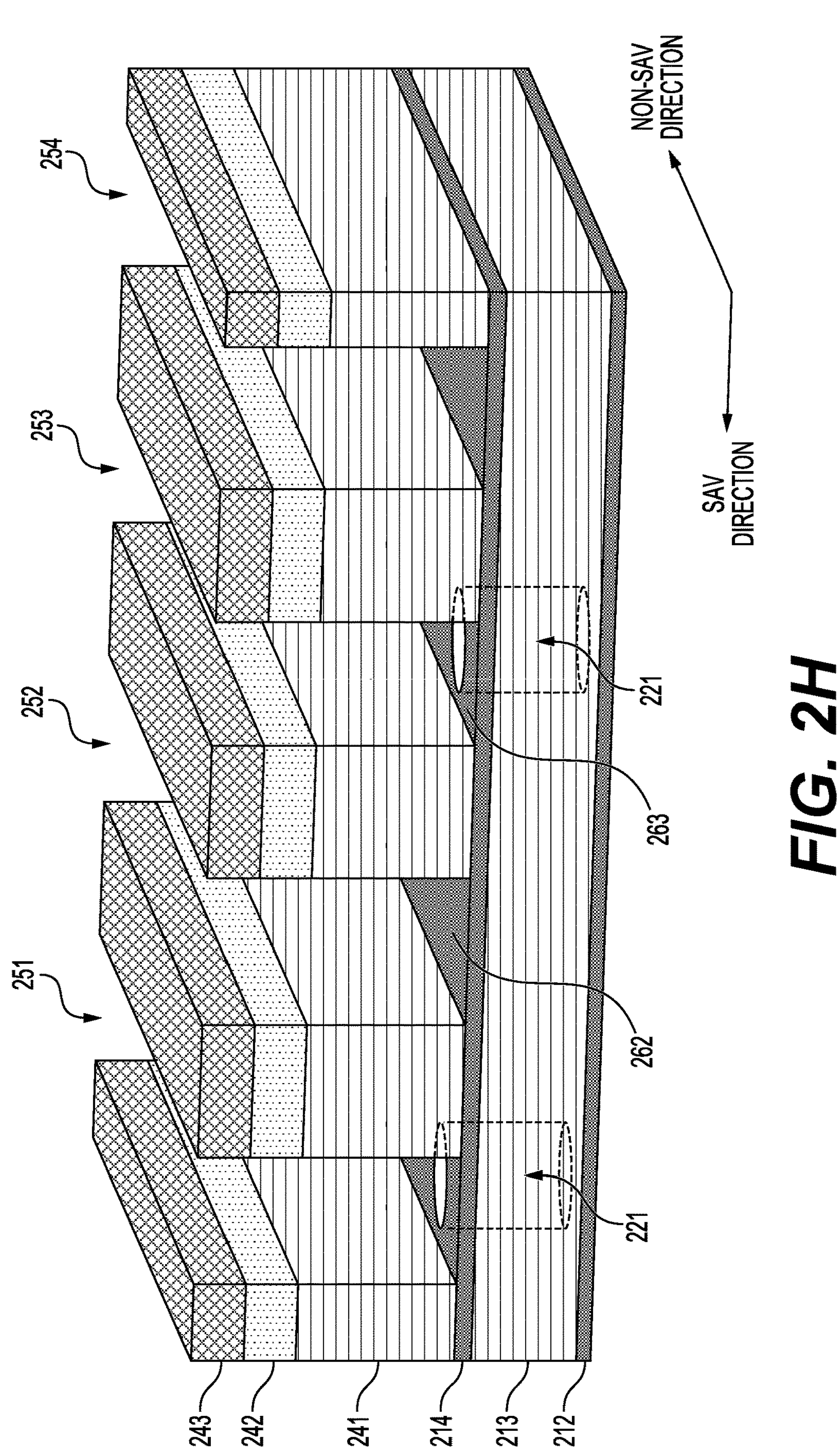
FIG. 2H shows a three-dimensional (3D) view of a portion of the semiconductor device.

FIG. 2H shows a three-dimensional (3D) view of a portion of the semiconductor device. The film stack including the layers 212-214 and 241-243 is shown. The 3D view corresponding to the stage of FIG. 2G. The vias 221-222 cross vertically through the bottom ESL 212, the via dielectric layer 213, and the middle ESL 214. The trenches 251-254 extend along the non-SAV direction and land on the middle ESL 214. As shown, the bottoms 262-263 of the trenches 252-253, respectively, are covered by the middle ESL 214, which protect the underlying via dielectric layer 213 during the trench etch process. Also shown are the top surfaces of the vias 221-222 which are not covered by the middle ESL 214. Also shown are the non-SAV direction and the SAV direction.

III. Comparison Between Conventional Approach and the New Approach

Figure 3:
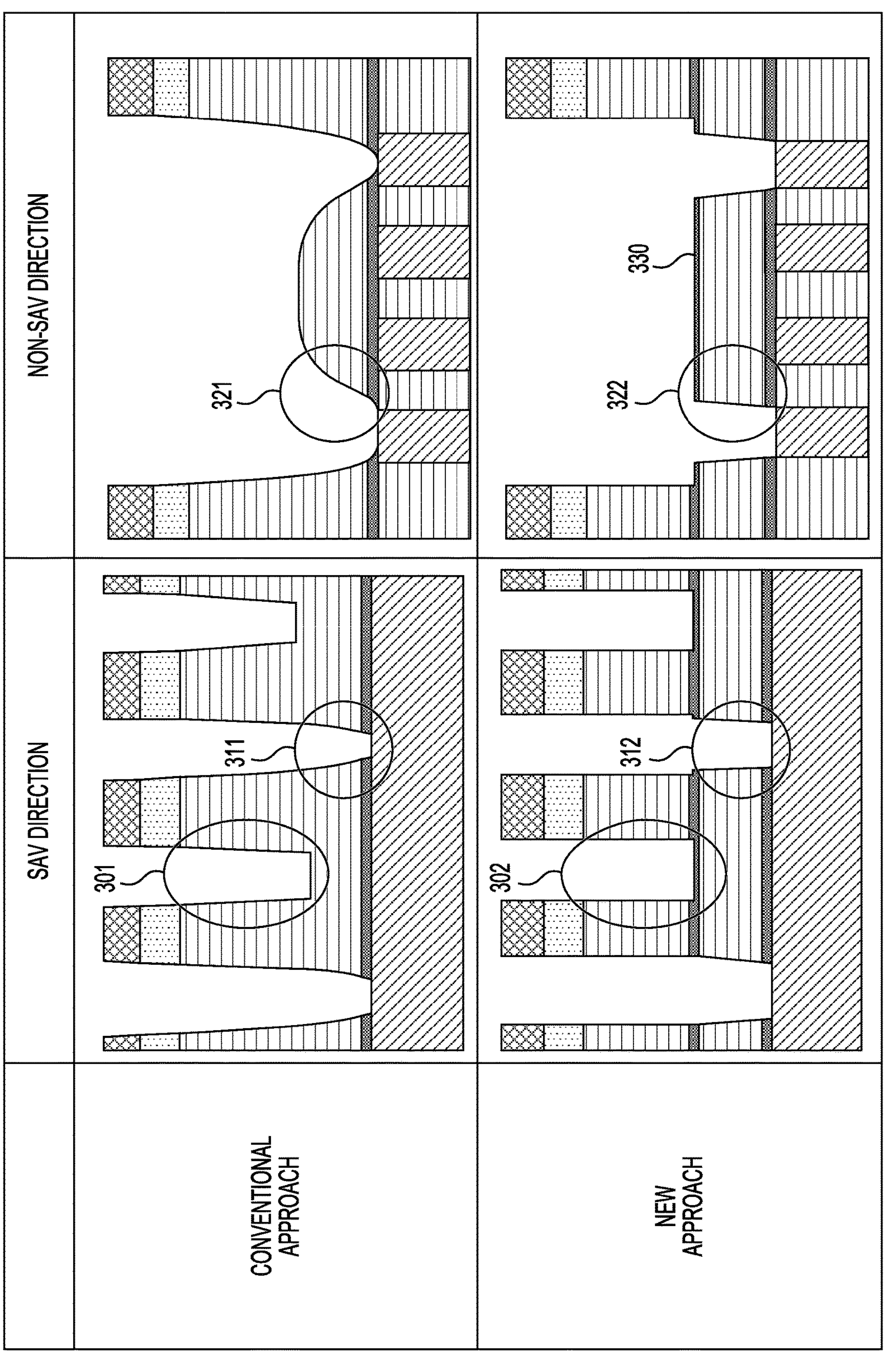
FIG. 3 shows a comparison between conventional approach and the new approach for BEOL interconnection formation.

FIG. 3 shows a comparison between conventional approach and the new approach for BEOL interconnection formation. Trench profile 301, via profile 311, and via profile 321 from the conventional approach are labelled and shown in the upper cross-sections. In comparison, trench profile 302, via profile 312, and via profile 322 from the new approach are labelled and shown in the lower cross-sections.

Comparing the trench profile 302 with the trench profile 301, the trench profile 301 has a tapered shape where the trench width dimension becomes narrower from the top to the bottom, while the trench profile 302 has a much wider bottom dimension than the trench profile 301. The trench profile 302 effectively reduces the trench line resistance.

Comparing the via profile 312 with the via profile 311, the via profile 312 has a much wider bottom dimension than the via profile 311 and, also, a much straighter sidewall profile than the via profile 311. The profile 312 effectively reduces the via line resistance and solves the via sidewall bowing issue.

Comparing the via profile 322 with the via profile 321, via chamfer defect is serious in the via profile 321, while via chamfer defect is eliminated in the via profile 322 due to the protection of the middle ESL 330. As shown, the middle ESL 330 can protect the trench bottom from being damaged (e.g., the via dielectric layer is etched down) during the trench etch process.

IV. BEOL Interconnection Fabrication Process

Figure 4:
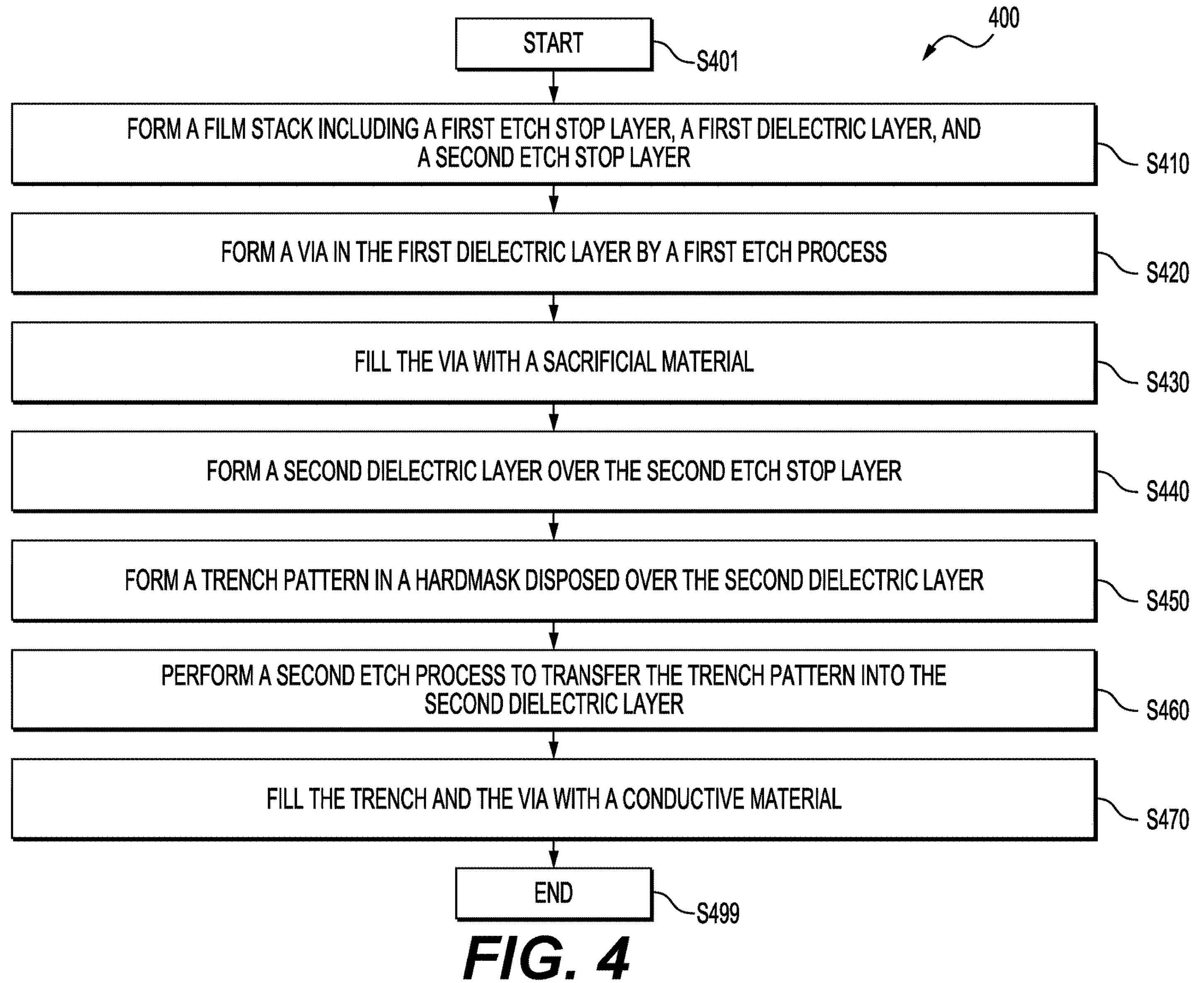
FIG. 4 shows a BEOL interconnection fabrication process 400 for making a semiconductor device according to an embodiment of the disclosure.

FIG. 4 shows a BEOL interconnection fabrication process 400 for making a semiconductor device according to an embodiment of the disclosure. It is noted that, in various examples, some steps shown in FIG. 4 may not be performed, and the steps listed in FIG. 4 example may be performed in different order. The process 400 starts from S401 and proceeds to S410.

At S410, a film stack can be formed. For example, the film stack can include a first etch stop layer over a metal layer disposed on a substrate, a first dielectric layer on the first etch stop layer, and a second etch stop layer over the first dielectric layer.

At S420, a via can be formed by a first etch process based on the first etch stop layer. The via extends through the second etch stop layer and the first dielectric layer and reaches the first etch stop layer.

At S430, the via can be filled with a sacrificial material.

At S440, a second dielectric layer can be formed over the second etch stop layer and the via that is filled with the sacrificial material.

At S450, a trench pattern can be formed in a hardmask disposed over the second dielectric layer. The trench pattern defines a trench that is aligned with the via that is filled with the sacrificial material.

At S460, a second etch process can be performed to transfer the trench pattern into the second dielectric layer. During the etch process, a bottom of the trench is landed on the second etch stop layer, the sacrificial material filled in the via is removed, and the metal layer is exposed.

At S470, the trench and the via can be formed with a conductive material to form an IDL interconnect structure. The process 400 can proceed to S499 and terminate at S499.

Many typical issues associated with the BEOL dual damascene etch can only get worse with future pitch scaling. The present disclosure provides solutions for solving these issues:

- Etch short via first for a better profile (less bowing), and avoid the challenges of traditional metal hardmask encroachment.
- Fill the via with organic material, which can be removed in-situ in the following trench etch.
- Add a middle ESL for trench to land on to straighten up trench profile.
- Targeting BEOL small pitch interconnect beyond N2 technology nodes.

Traditional BEOL dual damascene etch is facing ever increasing challenges with pitch scaling, due to the intrinsic smaller isolation material between via and trench and the smaller etch process window under smaller geometry. The proposed solution separates the via etch and trench etch, unlike the all-in-one process for the traditional dual damascene etch: short via first, filling via with organic material, and trench etch. The film stack also introduced an additional middle ESL for trench to land on.

The disclosure provides the following technical advantages:

- Etch a short via first with reduced aspect ratio for better via CD and profile (less bowing), increasing isolation with adjacent trench, and avoiding via depth loading (reduced variation).
- Introduce a middle ESL for trench to land on, to straighten up trench profile for lower line resistance.
- Avoid the SAV (self-aligned via) or metal hardmask selectivity requirement which are one of the top yield killing issues for BEOL, which can only get worse with smaller pitch.
- Fill the short via with organic material (such as OPL, BARC, amorphous carbon) instead of direct metallization as already being used, which can protect the etched via from being damaged during Trench etch and removed in-situ after trench line formation.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method, comprising:

forming a first dielectric layer over a metal layer disposed on a substrate and a first etch stop layer over the first dielectric layer, during a back-end-of-line (BEOL) process for making a semiconductor device;

forming a via that extends through the first etch stop layer and the first dielectric layer;
filling the via with a sacrificial material;
forming a second dielectric layer over the first etch stop layer and the via that is filled with the sacrificial material; and
performing a first etch process to form a trench in the second dielectric layer, the trench being landed on the first etch stop layer and aligned with the via, the sacrificial material filled in the via being removed during the first etch process;
forming a second etch stop layer over the metal layer and below the first dielectric layer, wherein the forming the via includes:
forming the via by performing a second etch process with the second etch stop layer as an etch stop layer.

2. The method of claim 1, wherein the forming the via that extends through the first etch stop layer and the first dielectric layer includes:
forming the via that extends through the first etch stop layer, the first dielectric layer, and the second etch stop layer.

3. The method of claim 1, wherein the second etch stop layer at a bottom of the via is removed to expose the metal layer after the sacrificial material filled in the via is removed during the first etch process.

4. The method of claim 1, wherein the sacrificial material includes an organic material.

5. The method of claim 1, further comprising:
performing an etch process or a chemical mechanical planarization (CMP) process to remove excessive sacrificial material before forming the second dielectric layer over the first etch stop layer and the via that is filled with the sacrificial material.

6. The method of claim 1, wherein the forming the via that extends through the first etch stop layer and the first dielectric layer includes:
forming a via pattern in a photoresist layer disposed over an antireflective coating (ARC) disposed over an organic planarization layer (OPL) covering the first etch stop layer;
transferring the via pattern into the first etch stop layer and the first dielectric layer; and
removing the photoresist layer, the ARC, and the OPL.

7. The method of claim 1, further comprising:
forming a trench pattern in a hardmask disposed over the second dielectric layer, the trench pattern defining the trench to be aligned with the via filled with the sacrificial material, wherein the trench pattern is transferred into the second dielectric layer during the first etch process to form the trench.

8. The method of claim 1, wherein the first dielectric layer and the second dielectric layer each have a dielectric constant lower than 3.

9. The method of claim 1, wherein the first etch stop layer includes silicon nitride, silicon carbide, silicon carbonitride, boron-doped silicon, silicon dioxide, oxygen-and-nitrogen-doped silicon carbide, or a combination of two or more thereof.

10. A semiconductor device, comprising:
a first dielectric layer;
a first etch stop layer over the first dielectric layer;
a second dielectric layer over the first etch stop layer; and
a conductive interconnect structure including a via portion and a trench portion, the trench portion extending in the second dielectric layer and a bottom of the trench portion landing on the first etch stop layer, the via portion disposed in the first dielectric layer and connected with the trench portion through the first etch stop layer;
a metal wiring layer inlaid in a substrate; and
a second etch stop layer over the metal wiring layer and underlying the first dielectric layer, wherein
the via portion is in connection with the metal wiring layer through the second etch stop layer.

11. The semiconductor device of claim 10, wherein the first dielectric layer and the second dielectric layer have a dielectric constant lower than 3.

12. The semiconductor device of claim 10, wherein the first etch stop layer includes silicon nitride, silicon carbide, silicon carbonitride, boron-doped silicon, silicon dioxide, oxygen-and-nitrogen-doped silicon carbide, or a combination of two or more thereof.

13. A method, comprising:
forming a first etch stop layer over a metal layer disposed on a substrate, a first dielectric layer on the first etch stop layer, and a second etch stop layer over the first dielectric layer, during a back end of line (BEOL) process for making a semiconductor device;
forming, by a first etch process based on the first etch stop layer, a via that extends through the second etch stop layer and the first dielectric layer and reaches the first etch stop layer;
filling the via with a sacrificial material;
forming a second dielectric layer over the second etch stop layer and the via that is filled with the sacrificial material;
forming a trench pattern in a hardmask disposed over the second dielectric layer, the trench pattern defining a trench that is aligned with the via that is filled with the sacrificial material;
performing a second etch process to transfer the trench pattern into the second dielectric layer, wherein, during the second etch process, a bottom of the trench is landed on the second etch stop layer, the sacrificial material filled in the via is removed, and the metal layer is exposed; and
filling the trench and the via with a conductive material;
wherein the first etch stop layer at a bottom of the via is removed to expose the metal layer after the sacrificial material filled in the via is removed during the second etch process.

14. The method of claim 13, wherein the forming, by the first etch process based on the first etch stop layer, the via that extends through the second etch stop layer and the first dielectric layer and reaches the first etch stop layer includes:
forming the via that extends through the second etch stop layer, the first dielectric layer, and the first etch stop layer during the first etch process.

15. The method of claim 13, wherein the sacrificial material includes an organic material.

16. The method of claim 13, wherein the forming, by the first etch process based on the first etch stop layer, the via that extends through the second etch stop layer and the first dielectric layer and reaches the first etch stop layer includes:
forming a via pattern in a photoresist layer disposed over an antireflective coating (ARC) disposed over an organic planarization layer (OPL) covering the second etch stop layer; and
transferring the via pattern into the second etch stop layer and the first dielectric layer.

17. The method of claim 13, wherein the second etch stop layer includes silicon nitride, silicon carbide, silicon carbonitride, boron-doped silicon, silicon dioxide, oxygen-and-nitrogen-doped silicon carbide, or a combination of two or more thereof.

* * * * *